United States Patent Office 3,274,036

Patented Sept. 20, 1966

3,274,036

ARC ETCHING

Merritt B. Andrews, Southwick, Mass., and Harry A. Hokanson, Manchester, Conn., assignors to United Aircraft Corporation, East Hartford, Conn., a corporation of Delaware No Drawing. Filed Aug. 2, 1962, Ser. No. 214,211
2 Claims. (Cl. 156—2)

This invention relates to thermocouples for thermoelectric devices and more particularly to a method of bonding thermocouples formed from semimetallic alloys of lead and tellurium, or lead and selenium and tellurium or compositions basically containing such elements to other metals.

As is known in the thermoelectric art, it is abundantly important to minimize the electrical resistance at contact junctions between the thermoelectric elements and conducting members of the unit. Thermoelectric materials have heretofore been employed in thermoelectric devices similar to those described in U.S. Patent No. 2,811,570, entitled "Thermoelectric Elements and Method of Making Such Elements," issued October 29, 1957, U.S. Patent No. 2,811,571, entitled "Thermoelectric Generators," issued October 29, 1957, and U. S. Patent No. 2,811,569, entitled "Contacting Semi-Metallic Electrical Conductors," issued on October 29, 1957. When fabricating thermocouples formed from these compositions into a thermoelectric device, it has been found that when the telluride thermocouple is heated to any degree, the contact surface of the thermocouple would exhibit an unsatisfactory electrical contact resistance. Apparently, the tellurium, as a result of being exposed to high temperatures, migrates to and deposits on the surface of the thermocouple and eventually oxidizes to form tellurium oxide. The tellurium oxide being a dielectric imposes a high resistance surface film on the thermocouple contact surface, thus impeding the efficiency of the thermocouple. As for example, when a lead telluride thermocouple bonded to an iron plate diffusion barrier is brazed at a high temperature to copper, the surface between the iron plate and the lead telluride exhibits a powdery substance which produces high electrical contact resistance.

In order to obviate this disadvantage, that is to say, to reduce the electrical contact resistance, we have invented a process for pretreating the telluride thermocouple prior to bonding the thermocouple to the thermoelectric device. We have successfully experimented with bonding lead telluride thermocouples to an iron plate whereby the combined iron plate and thermocouple is in turn bonded to an electrical conducting material such as copper and the like. The method of bonding is not considered to be a part of this invention, and therefore, for simplicity, a detailed description thereof will be eliminated. However, it will be appreciated that our invention is not limited to the particular materials described hereinafter, but as will be understood by those skilled in the art, the method has applications whenever it is desirable to bond telluride semimetallic alloy to other materials.

The method comprises cleansing the preshaped telluride material thermocouple by subjecting the material to a concentrated nitric acid bath. The contact surfaces of the thermocouple, that is, the surfaces that are placed in contact with the other material, are then bombarded by a concentrated emittance of electrons in a manner known in the art. Or the surfaces may be given an electromachining treatment, by an electrical discharge machine, which is well-known in the art such as the Elax. Either treatment serves to vaporize the tellurium from the telluride surface region. If the vaporized tellurium condenses on the now telluride depleted surface, it can be removed by chemical or merely by subjecting it to a second concentrated nitric acid bath. The thermocouple may then be bonded to an iron plate, which iron plate and thermocouple combination may be brazed to copper conducting elements of the thermoelectric device.

While electromachining has proven to be successful by subjecting the material to electrical discharge machining, it is contemplated by this invention that the electromachining may be also carried out by other means capable of local heating such as electron beam machines, lasers, plasma torches, etc.

It should be understood that the invention is not limited to the particular method described herein, but that various changes and modifications may be made without departing from the spirit or scope of this novel concept.

We claim:

1. The method of pretreating a thermoelectric element prior to bonding said element to a metallic substance, said element having opposed bare end faces which faces constitute contact surfaces, and being formed from lead telluride semimetallic alloy comprising the steps of cleansing the contact surfaces by subjecting the surfaces to concentrated nitric acid bath, depleting the surface of tellurium by bombarding the surface with a concentrated emittance of electrons, and again subjecting the surface to a concentrated nitric acid bath.

2. The method of pretreating a thermoelectric element prior to bonding said element to a metallic substance, said element having opposed bare end faces which faces constitute contact surfaces, and being formed from lead telluride semimetallic alloy comprising the steps of cleansing the contact surface by subjecting the surface to a concentrated nitric acid bath, depleting the surface of tellurium by subjecting the surface to an electromachining treatment, and again subjecting the surface to a concentrated nitric acid bath.

References Cited by the Examiner

UNITED STATES PATENTS

| | | | |
|---|---|---|---|
| 2,778,926 | 1/1957 | Schneider | 148—1.5 X |
| 2,803,569 | 8/1957 | Jacobs et al. | 148—1.5 |
| 2,822,250 | 2/1958 | De Nobel | 156—17 X |
| 2,989,385 | 6/1961 | Gianola et al. | 156—8 |

FOREIGN PATENTS

| | | |
|---|---|---|
| 754,456 | 8/1956 | Great Britain. |

OTHER REFERENCES

Fritts, R. W.: "Lead Telluride Alloys and Junctions." In: Cadoff, I. B., and Miller, E., "Thermoelectric Materials and Devices." Reinhold Pub. Corp., New York, Oct. 6, 1960 ©. Pps. 156–159.

WINSTON H. DOUGLAS, *Primary Examiner.*

JOHN H. MACK, *Examiner.*

A. M. BEKELMAN, *Assistant Examiner.*